United States Patent [19]

Branson et al.

[11] Patent Number: 4,712,058

[45] Date of Patent: Dec. 8, 1987

[54] ACTIVE LOAD NETWORK

[75] Inventors: Christopher W. Branson; Steven K. Sullivan, both of Beaverton, Oreg.

[73] Assignee: Tektronix, Inc., Beaverton, Oreg.

[21] Appl. No.: 888,908

[22] Filed: Jul. 22, 1986

[51] Int. Cl.$^4$ .............................................. G01R 19/00
[52] U.S. Cl. .............................. 324/23 R; 324/158 R
[58] Field of Search ............... 307/584, 571, 585, 262, 307/270; 324/73 R, 73 AT, 158 R

[56] References Cited

U.S. PATENT DOCUMENTS

| | | | |
|---|---|---|---|
| T955,006 | 2/1977 | Cavaliere et al. | 307/585 |
| 3,492,572 | 1/1970 | Jones et al. | 324/158 R |
| 3,849,726 | 11/1974 | Justice | 324/73 R |
| 3,936,676 | 2/1976 | Fujita | 307/270 |
| 4,019,178 | 5/1977 | Hashimoto et al. | 307/585 |
| 4,024,415 | 5/1977 | Matsuura | 307/585 |
| 4,027,305 | 5/1977 | Kishimoto | 307/270 |
| 4,038,564 | 7/1977 | Hakata | 307/270 |
| 4,216,539 | 8/1980 | Raymond et al. | 324/73 R |
| 4,357,574 | 11/1982 | Tamisawa et al. | 324/73 R |
| 4,380,710 | 4/1983 | Cohen et al. | 307/585 |
| 4,472,678 | 9/1984 | Lauriello | 324/73 R |
| 4,540,904 | 9/1985 | Ennis et al. | 307/585 |
| 4,570,262 | 2/1986 | Barbknecht et al. | 324/73 R |

OTHER PUBLICATIONS

"Three-State Device and Circuit Testing", by Flaherty et al, IBM Tech. Disc. Bull., vol. 25, #11B, 4/83, pp. 6276–6290.

*Primary Examiner*—Reinhard J. Eisenzopf
*Assistant Examiner*—W. Burns
*Attorney, Agent, or Firm*—William O. Geny; Robert S. Hulse

[57] ABSTRACT

An active load network for a device under test includes a logic circuit for anticipating the output state of the device under test and for turning on either a current source of a current sink to properly load its output. The current sink and current source each comprise a pair of CMOS transistors connected in series. One of each transistor pair turns on to either source or sink current and the other provides a variable impedance controlled by the voltage at its gate to regulate the amount of current. A pull-to-center transmission gate is also provided which pulls the output of the device under test to a level between a logic high and logic low when it is turned off.

8 Claims, 4 Drawing Figures

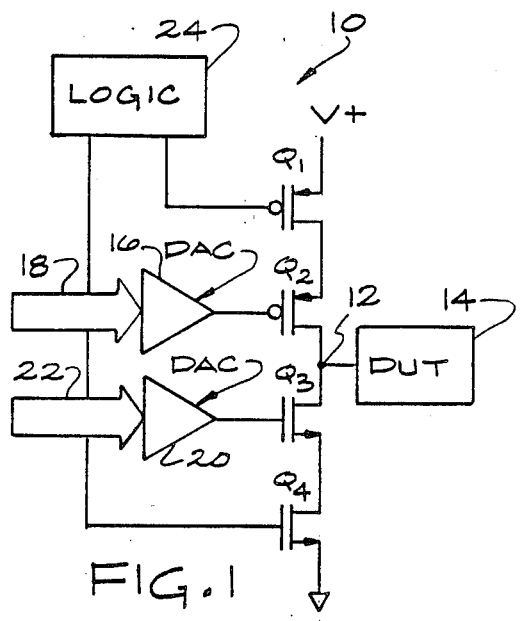
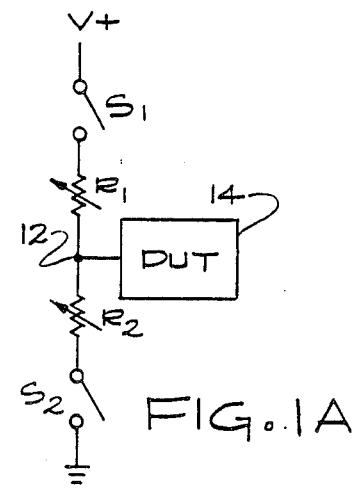
FIG. 1
FIG. 1A
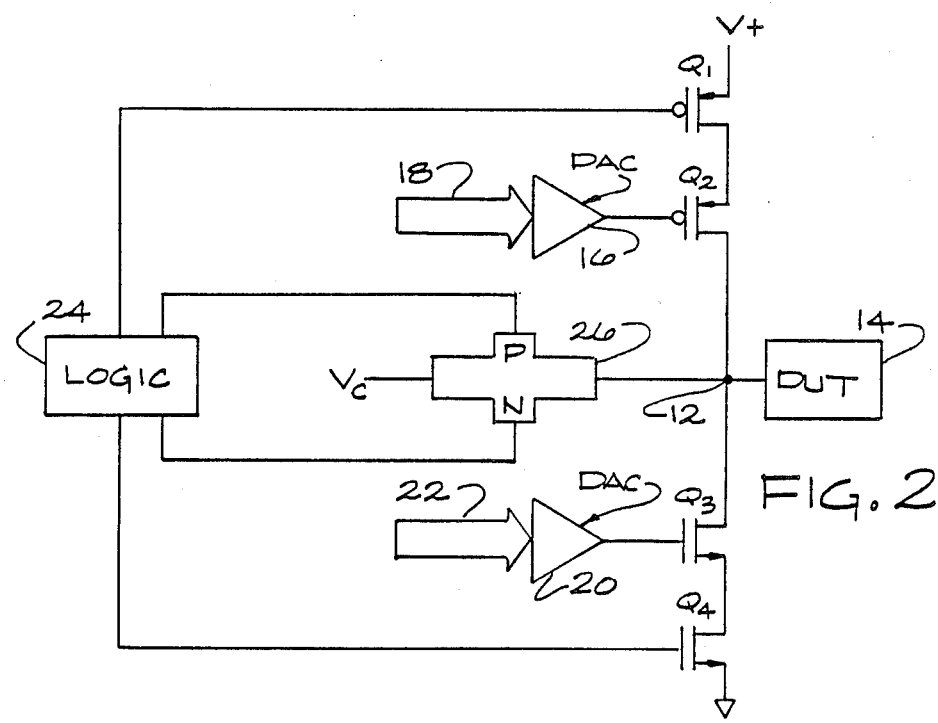
FIG. 2

ACTIVE LOAD NETWORK

BACKGROUND OF THE INVENTION

The following invention relates to an active load network for a digital test system for providing proper output loads to a device under test.

Automatic test equipment is frequently employed to run diagnostic tests on integrated circuit devices. The purpose of the testing devices is to ensure that integrated circuits under test provide the proper output voltages given the input stimulus of the tester. It is necessary with such devices to simulate the proper output load, where the output voltage may range from a high logic level voltage (for example, 5 volts) to a low logic level voltage (0 volts). In the past, this function has been accomplished by a diode bridge connected to the output pin of interest of a device under test and current generators connected to opposite arms of the bridge. In order to provide the proper load for the device under test, it is necessary to source current to the device under test when the output is low, and to sink current from the device under test when its output is high. The switching of the diode bridge is controlled by a reference voltage connected to the bridge opposite the input from the device under test. A problem encountered with such devices is the switching speed of the diode bridge when the device under test changes from an inhibited state to either a logic high or a logic low output state. In such instances voltages cannot change quickly across the diode bridge because of the capacitance of the bridge driven by the relatively low current levels provided by the current generators. Thus, the switching between an inhibited output and either high or low logic levels to properly load the device under test is too slow for the current generation of integrated circuit devices.

Another problem with such prior art devices is that they are incapable of pulling the output of the device under test to a predetermined voltage level in the event that the device under test is inhibited.

SUMMARY OF THE INVENTION

The present invention provides a rapidly switching active load for a digital test circuit including a logic circuit for providing control signals which are based upon the expected logic output state of a device under test. Connected to the logic circuit is an active transistor network which provides an output load for the device under test based upon the control signals from the logic circuit. The transistor network provides a first load condition when the device under test is expected to have a high logic signal output, and provides a second load condition when the device under test is expected to have a low logic signal output.

The transistor network may comprise a pair of P-type CMOS transistor gates connected in series between a voltage source and a node which is connected to the output of the device under test. Also connected to the same node are a pair of N-type CMOS transistor devices which are connected between the node and ground. The one set of CMOS transistors function as variable impedance gates and may be connected to a digital to analog converter for establishing a predetermined voltage level on their respective gates. This controls the amount of current flow into or out of the device under test. The second CMOS transistor in each pair is controlled by the logic circuitry which turns on or off one or the other, or both, of the CMOS transistors depending upon the expected output logic state of the device under test.

The invention may also include a CMOS transmission gate connected to the node which may function as a pull-to-center device when neither a high nor a low logic state is expected from the device under test. The switching on or off of the pull-to-center CMOS transistor is controlled by the logic circuitry.

It is a primary object of this invention to provide an active load network for a device under test for providing rapid switching between an inhibited state and either high or low logic states.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 1 is a schematic diagram of the active load network of the present invention.

FIG. 1a is a schematic diagram of an equivalent circuit of the active load network of FIG. 1.

FIG. 2 is a schematic diagram of a second embodiment of the invention, including a center potential transmission gate.

DETAILED DESCRIPTION OF THE INVENTION

Figure 3:
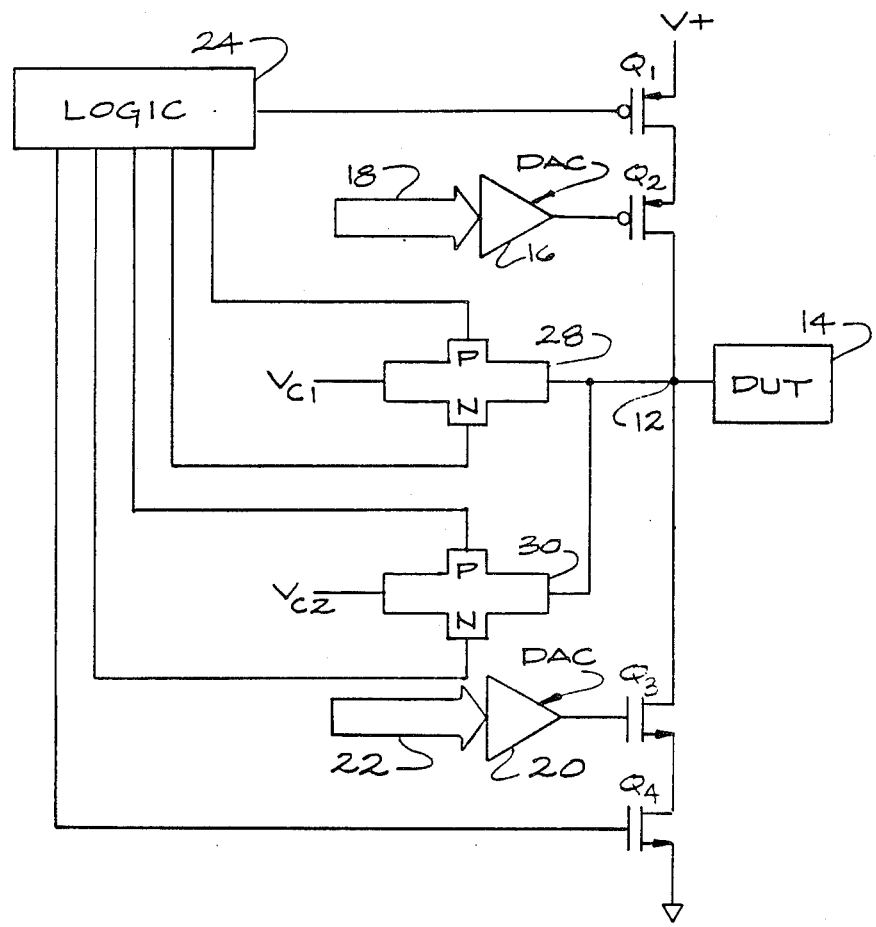
FIG. 3 is a schematic diagram of a further embodiment of the invention having a center potential circuit comprising a pair of transmission gates.

An active load network 10 includes a CMOS transistor Q1 connected to a voltage source V+. A second CMOS transistor Q2 is connected in series with Q1 and its drain is connected to a node 12 which is in turn connected to a device under test (DUT) 14. Q1 and Q2 are P-type CMOS transistors. Q1 is a variable impedence transistor whose impedence is controlled by the voltage output of a digital-to-analog converter (DAC) 16. The input to DAC 16 is a multibit bus 18 which provides a digital code as the input to the DAC 16. A third CMOS transistor Q3 is an N-type transistor whose source is connected to node 12 and whose drain is connected to a fourth CMOS transistor Q4. The source of Q4 is connected to ground. Q3 is a variable impedance transistor whose impedence is controlled by the voltage output of DAC 20. The voltage output of DAC 20 is set by a digital code provided to the input of DAC 20 over bus 22.

An equivalent circuit to the circuit of FIG. 1 is shown in FIG. 1a. Transistor Q1 functions like switch S1, and Q2 functions like a variable resistor R1. Q3 functions like a variable resistor R2, and Q4 functions like switch S2.

The operation of the circuit of FIG. 1 is based upon the expected logic state output of DUT 14. Thus, a logic circuit 24 under the control of a host computer (not shown) anticipates whether the output of the DUT 14 should be in a logic high state or a logic low state. When a logical low is expected from DUT 14, logic circuit 24 turns on Q1. DAC 16 is adjusted by a digital code on bus 18 to provide the proper impedance for sourcing the right amount of current from the voltage source V+ to DUT 14. It is necessary to adjust the impedance of this circuit because CMOS transistors functioning essentially as analog devices for high speed applications may have very wide variations in their operating parameters. For this reason, it is often necessary to calibrate the transistor network and to provide a digital code for bus 18 which will yield the proper amount of source current for DUT 14. When DUT 14 is in a high logic level state, transistors Q3 and Q4 provide a current sink. In this instance, the logic circuit 24 turns Q1 off and turns Q4 on. At the same time, the output of DAC 20 turns on Q3 providing a variable impedance for the current from DUT 14.

The DUT 14 may include not only a logic high and a logic low state, but may sometimes be turned off. In such cases, its voltage tends to float. A pull-to-center circuit comprising transmission gate 26 is provided (refer to FIG. 2) when both Q1 and Q4 are off and the expected logical state of the output of DUT 14 is off. In this case, the logic circuit 24 turns on transmission gate 26 which pulls the output of DUT 14 to the source voltage Vc.

In addition, logic circuit 24 may inhibit the active load network entirely. This may occur at times when it is desired to run other tests on DUT 14 which require input pulses to be applied to node 12. In such a case any current applied to node 12 might alter the shape of the pulses applied thereto and therefore provision may be made for inhibiting Q1, Q4 and gate 26.

Referring to FIG. 3, more than one pull-to-center circuit may be utilized if desired to provide the user with more than one center voltage. In this case, a pair of transmission gates 28 and 30 respectively are provided which include separate voltage sources Vc1 and Vc2, respectively, connected to the source electrode of each of the transmission gates 28 and 30. This provides a more accurate means of verifying the true output state of the DUT 14 when it is expected that its state will be neither a logic high nor a logic low.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. An active load network for a digital test system comprising:
   (a) logic circuit means for providing control signals based upon the expected logic output state of a device under test;
   (b) a first active load circuit responsive to said control signals for providing a source of current to said device under test when a low level logic output signal is expected from said device under test;
   (c) a second active load circuit responsive to said control signals for providing a current sink for said device under test when a high level logic output signal is expected from said device under test; and
   (d) said first and second active load circuits each comprising a pair of CMOS transistors connected in series wherein one transistor in each CMOS transistor pair comprises a variable impedance gate for regulating the flow of current through each of said first and second active load circuits, and the other transistor in each CMOS transistor pair comprises an on/off switch for each respective active load circuit.

2. The active load network of claim 1, further including transmission gate means connected to said device under test in parallel with said first and second active load circuits for establishing a center voltage for said device under test when the output of said device under test is neither a logic high nor a logic low.

3. The active load network of claim 2 wherein said transmission gate means comprises a pair of transmission gates, each of said gates having a source electrode connected to a separate voltage source.

4. The active load circuit of claim 3 wherein either of said pair of transmission gates may be selectively actuated by said logic circuit means to provide said device under test with one of two possible center voltage outputs.

5. An active load network for a digital test system comprising:
   (a) logic circuit means for providing control signals based upon the expected logic output state of a device under test;
   (b) active transistor means for providing an output load for said device under test based upon said control signals from said logic circuit means such that said transistor means provides a first load condition when said device under test is expected to have a high logic signal output, and said transistor means provides a second load condition when said device under test is expected to have a low logic signal output; and
   (c) said active transistor means comprising a pair of P-type CMOS transistors connected in series between a voltage source and a node, and a pair of N-type CMOS transistors connected in series between said node and ground potential, said node being connected to the output of said device under test, wherein one of said P-type CMOS transistors and one of said N-type CMOS transistors are variable impedance transistors controllable by an input voltage from a digital-to-analog converter wherein the input to said digital-to-analog converter represents a digital code representing a calibration factor to compensate for variations in the operating parameters of said pairs of P-type and N-type CMOS transistors.

6. The active load network of claim 5, further including center potential circuit means for pulling the output of said device under test to a predetermined voltage level when said device under test is in neither a high nor a low logic state.

7. The active load network of claim 6 wherein said center potential circuit means comprises a CMOS transmission gate means having a source electrode connected to a predetermined voltage source.

8. The active load network of claim 7 wherein said center potential circuit comprises a plurality of transmission gate means connected to said node, each of said transmission gates having differing voltages connected to their respective source electrodes, and each of said transmission gates being selectively controllable.

* * * * *